United States Patent
Yang et al.

(10) Patent No.: US 11,811,404 B2
(45) Date of Patent: *Nov. 7, 2023

(54) LATCH CIRCUIT, MEMORY DEVICE AND METHOD

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: XiuLi Yang, Hsinchu (TW); Kuan Cheng, Hsinchu (TW); He-Zhou Wan, Hsinchu (TW); Ching-Wei Wu, Hsinchu (TW); Wenchao Hao, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/525,270

(22) Filed: Nov. 12, 2021

(65) Prior Publication Data

US 2022/0069807 A1 Mar. 3, 2022

Related U.S. Application Data

(63) Continuation of application No. 16/796,800, filed on Feb. 20, 2020, now Pat. No. 11,190,169.

(30) Foreign Application Priority Data

Dec. 26, 2019 (CN) .......................... 201911368893.4

(51) Int. Cl.
G11C 8/00 (2006.01)
H03K 3/012 (2006.01)
(Continued)

(52) U.S. Cl.
CPC ............. *H03K 3/012* (2013.01); *G11C 7/10* (2013.01); *G11C 7/222* (2013.01); *H03K 3/0372* (2013.01)

(58) Field of Classification Search
CPC ..................................................... G11C 7/222
(Continued)

(56) References Cited

U.S. PATENT DOCUMENTS 5,256,059 A 11/1993 Wells et al.
7,002,875 B2 2/2006 Ikeda
(Continued)

FOREIGN PATENT DOCUMENTS

TW 201722076 6/2017
WO 2014043856 3/2014

OTHER PUBLICATIONS

Office Action dated Jun. 9, 2021 for corresponding case No. TW 11020550040. (pp. 1-12).

*Primary Examiner* — Hoai V Ho
(74) *Attorney, Agent, or Firm* — Hauptman Ham, LLP

(57) ABSTRACT

A latch circuit includes a latch clock generator configured to generate a latched clock signal based on a clock signal and a first enable signal, and an input latch coupled to the latch clock generator to receive the latched clock signal. The input latch is configured to generate a latched output signal based on the latched clock signal and an input signal. In response to the first enable signal having a disabling logic level, the latch clock generator is configured to set a logic level of the latched clock signal to a corresponding disabling logic level, regardless of the clock signal. The latch clock generator (Continued)

includes a first inverter configured to generate an inverted signal of the first enable signal, and a NAND gate coupled to the first inverter to receive the inverted signal of the first enable signal. The NAND gate is configured to generate the latched clock signal based on the clock signal and the inverted signal of the first enable signal.

20 Claims, 11 Drawing Sheets

(51) Int. Cl.
*G11C 7/10* (2006.01)
*G11C 7/22* (2006.01)
*H03K 3/037* (2006.01)

(58) Field of Classification Search
USPC ..................................................... 365/233.1
See application file for complete search history.

(56) References Cited

U.S. PATENT DOCUMENTS

| | | |
|---|---|---|
| 7,154,319 B2 | 12/2006 | Kim |
| 9,419,590 B2 | 8/2016 | Berzins et al. |
| 9,577,635 B2 * | 2/2017 | Rasouli .............. H03K 17/6872 |
| 11,190,169 B2 * | 11/2021 | Yang .................... H03K 3/0372 |
| 2002/0078316 A1 | 6/2002 | Nakamura et al. |
| 2015/0029795 A1 | 1/2015 | Kohli et al. |
| 2018/0294799 A1 | 10/2018 | Jarrar et al. |

* cited by examiner

| WEB | EN | WEB1B | CKD | D-Latch | Operation |
|---|---|---|---|---|---|
| 0 | 1 | 1 | CKD | Hold | Write |
| 0⇒1 | 1 | 0 | 1 | Hold | Write |
| 1 | 1 | 0 | 1 | Hold | Non-write |
| 1⇒0 | 1 | 1 | CKD | Hold | Non-write |
| 0 | 0 | 1 | 0 | Pass | Non-write |
| 0⇒1 | 0 | 0 | 1 | Hold | Non-write |
| 1 | 0 | 0 | 1 | Hold | Non-write |
| 1⇒0 | 0 | 1 | 0 | Pass | Non-write |

FIG. 5B

LATCH CIRCUIT, MEMORY DEVICE AND METHOD

RELATED APPLICATIONS

The present application is a continuation of U.S. application Ser. No. 16/796,800, filed Feb. 20, 2020, which claims priority to the China Patent Application No. 201911368893.4, filed Dec. 26, 2019. The entire contents of the above-referenced applications are incorporated herein by reference.

BACKGROUND

Processors and memories are various parts of electronic devices. The performance of a memory, such as capacity, access speed, or the like, impacts the overall performance of the electronic device. Power consumption is a design consideration for memories, especially in advanced electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5B is a truth table corresponding to the latch clock generator of FIG. 5A.

DETAILED DESCRIPTION

Figure 1A:
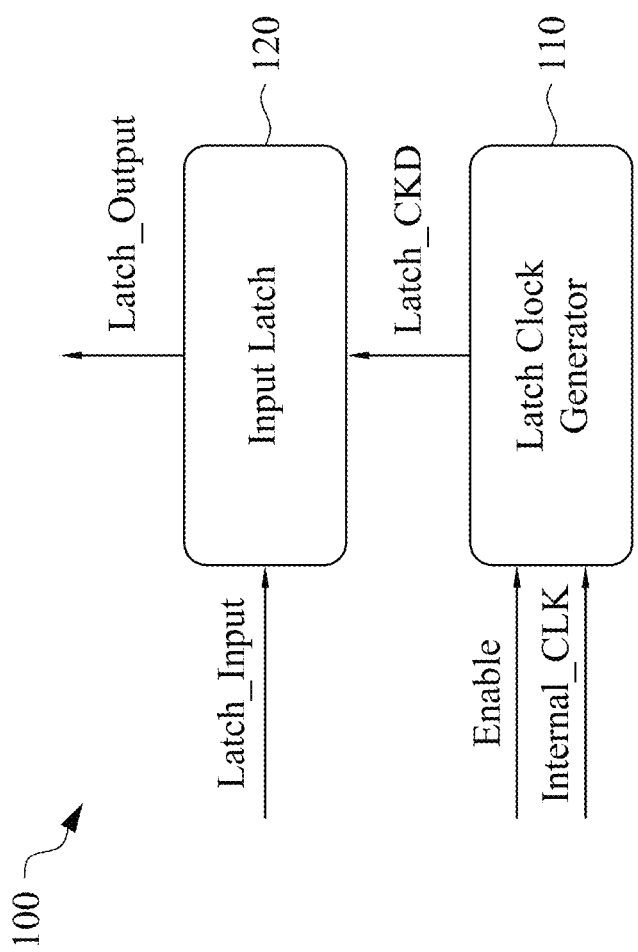
FIG. 1A is a schematic block diagram of a latch circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Latches are used in various electronic devices, including, but not limited to, memories. A latch is configured to receive an input signal and a clock signal. The latch is configured to pass the input signal to an output of the latch in response to a first logic level (e.g., logic "low") of the clock signal—this is referred to as a "pass" state of the latch. The latch is further configured to hold the output unchanged in response to a second logic level (e.g., logic "high") of the clock signal—this is referred to as a "hold" state of the latch. In some other approaches, when a function or a circuit of an electronic device is not needed or is to be disabled, a latch corresponding to the function or circuit still passes an input signal to an output of the latch. Such signal passing, when the corresponding function or circuit is to be disabled, unnecessarily consumes power. To address this concern, in some embodiments, an enable signal is supplied to a clock generator configured to generate the clock signal for the latch. When the enable signal has a disabling logic level to disable the function or circuit corresponding to the latch, the clock generator is configured to set the clock signal to a logic level corresponding to the "hold" state of the latch. As a result, the output of the latch is held unchanged while the function or circuit corresponding to the latch is disabled. Such signal holding reduces power consumption in one or more embodiments. Some embodiments achieve power consumption reduction by a few logic elements, without additional requirements for chip area. In at least one embodiment, coupling noises to/from other circuitry in the electronic device are decreased.

FIG. 1A is a schematic block diagram of a latch circuit 100, in accordance with some embodiments. Latch circuit 100 comprises a latch clock generator 110 and an input latch 120. Latch clock generator 110 is configured to generate a latched clock signal Latch_CKD based on a clock signal Internal_CLK and an signal Enable. Input latch 120 is coupled to latch clock generator 110 to receive latched clock signal Latch_CKD, and configured to generate a latched output signal Latch_Output based on latched clock signal Latch_CKD and an input signal Latch_Input. In the example configuration in FIG. 1A, signal Enable and clock signal Internal_CLK are input into latch clock generator 110. However, other configurations are within the scopes of various embodiments. For example, in at least one embodiment, clock signal Internal_CLK is generated in latch clock generator 110.

In some embodiments, at least one of latch clock generator 110 or input latch 120 comprises circuit elements coupled to perform the functionality and/or operation described herein. Examples of such circuit elements include, but are not limited to, transistors, diodes, capacitors, resistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like), FinFETs, planar MOS transistors with raised source/drains, or the like. In one or more embodiments, circuit elements of at least one of latch clock generator 110 or input latch 120 are coupled to form one or more logic elements. Examples of logic elements include, but are not limited to, inverters (NOT), AND, OR, NAND, NOR, XOR, XNOR. An example configuration for latch clock generator 110 is described with respect to FIG. 5A. In some embodiments, input latch 120 comprises a latch as described herein. An example latch configuration is a D-Latch. Other configurations are within the scopes of various embodiments.

Figure 1B:
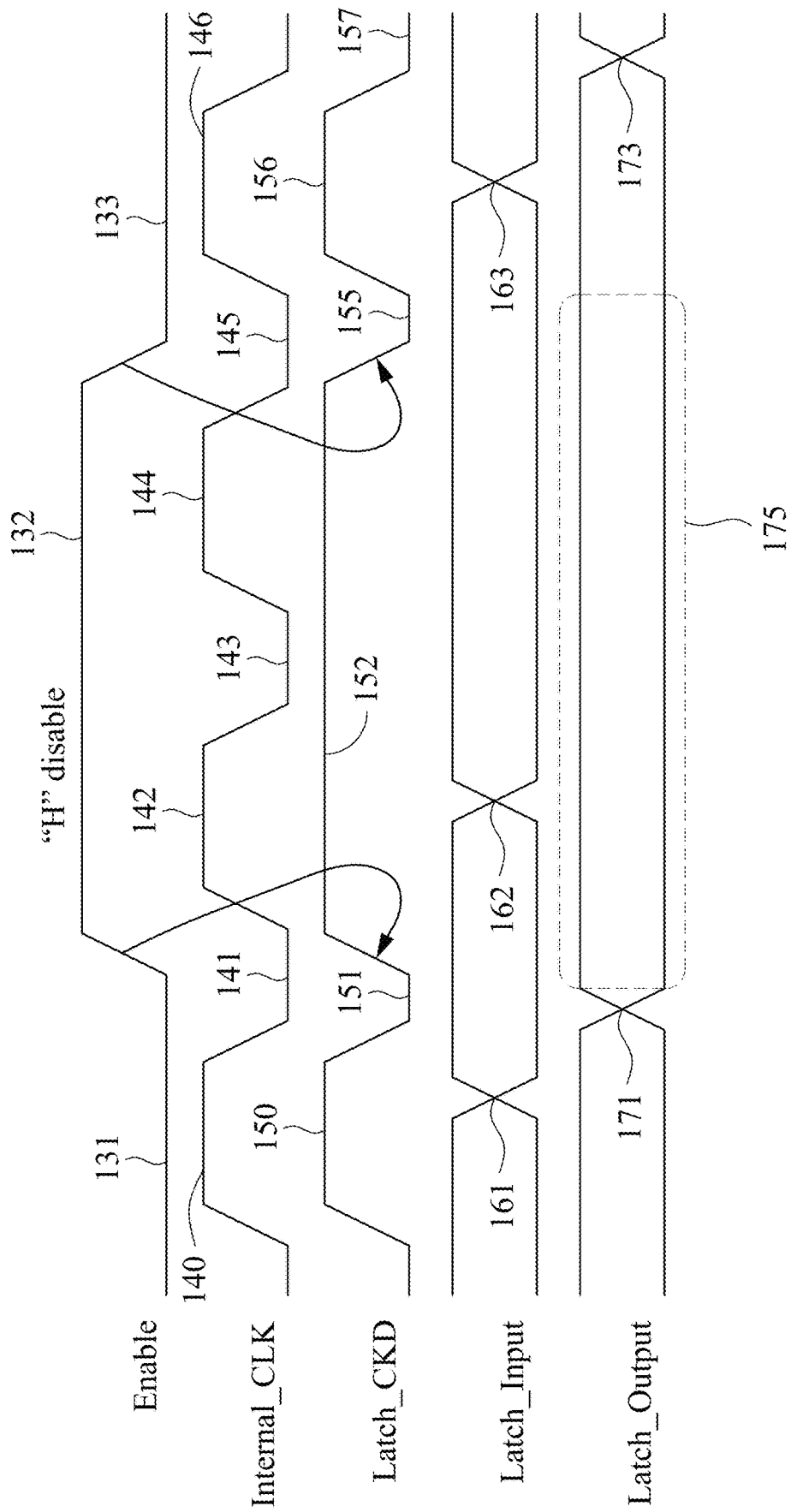
FIG. 1B includes time graphs of various signals in the latch circuit of FIG. 1A.

FIG. 1B includes time graphs of various signals in latch circuit 100 in accordance with some embodiments. Signal Enable has a disabling logic level, e.g., at 132, to disable a function or a circuit associated with latch circuit 100 in an electronic device. Signal Enable further has an enabling logic level, e.g., at 131 and 133, to enable the function or circuit associated with latch circuit 100 in the electronic device. In the example in FIG. 1B, the disabling logic level of signal Enable is logic "high," as indicated by a label "H" disable in FIG. 1B, and the enabling logic level of signal Enable is logic "low." Other configurations, such as when the disabling logic level is logic "low" and the enabling logic level is logic "high," are within the scopes of various embodiments.

Clock signal Internal_CLK has a logic level that is periodically switched between logic "high" at 140, 142, 144, 146 and logic "low" at 141, 143, 145 in accordance with a clock frequency.

In response to signal Enable having the enabling logic level, latch clock generator 110 is configured to switch a logic level of latched clock signal Latch_CKD in accordance with clock signal Internal_CLK. For example, when signal Enable has the enabling logic level at 131, 133, the logic level of latched clock signal Latch_CKD is switched between logic "high" at 150, 156 corresponding to logic "high" of clock signal Internal_CLK at 140, 146, respectively, and logic "low" at 151, 155, 157 corresponding to logic "low" of clock signal Internal_CLK at 141, 145, respectively.

Further, in response to signal Enable having the disabling logic level, latch clock generator 110 is configured to set the logic level of latched clock signal Latch_CKD to a corresponding disabling logic level. For example, when signal Enable has the disabling logic level at 132, the logic level of latched clock signal Latch_CKD is set to logic "high" at 152, regardless of clock signal Internal_CLK which is switched between logic "high" at 142, 144 and logic "low" at 143. Logic "high" of latched clock signal Latch_CKD is a disabling logic level because it corresponds to the "hold" state of input latch 120 and disables logic level switching at the output of input latch 120, as described herein. In the example in FIG. 1B, a rising edge between 131 and 132 in signal Enable causes a corresponding rising edge between 151 and 152 in latched clock signal Latch_CKD, and a falling edge between 132 and 133 in signal Enable causes a corresponding falling edge between 152 and 155 in latched clock signal Latch_CKD. As a result, the logic level of latched clock signal Latch_CKD is set to logic "high" at 152 corresponding to the disabling logic level of signal Enable at 132.

Latched clock signal Latch_CKD is supplied from latch clock generator 110 into input latch 120 to be used as a clock signal for input latch 120. In the example configuration in FIG. 1B, input latch 120 is in the "hold" state when the logic level of latched clock signal Latch_CKD is at logic "high," and is in the "pass" state when the logic level of latched clock signal Latch_CKD is at logic "low." Other configurations, e.g., where input latch 120 is in the "pass" state when the logic level of latched clock signal Latch_CKD is at logic "high," and is in the "hold" state when the logic level of latched clock signal Latch_CKD is at logic "low," are within the scopes of various embodiments.

As described herein, when signal Enable has the enabling logic level, the logic level of latched clock signal Latch_CKD is switched in accordance with clock signal Internal_CLK. In response to the switched logic level of latched clock signal Latch_CKD, input latch 120 is configured to switch a logic level of latched output signal Latch_Output in accordance with input signal Latch_Input. For example, when signal Enable has the enabling logic level at 131, input latch 120 is in the "hold" state when latched clock signal Latch_CKD is at logic "high" at 150, and is in the "pass" state when latched clock signal Latch_CKD is at logic "low" at 151. In the example in FIG. 1B, input signal Latch_Input is a differential signal including two component signals of opposite logic levels. A logic level of input signal Latch_Input is switched at 161, 162, 163, when one of the two component signals is switched from logic "high" to logic "low" and the other component signal is switched from logic "low" to logic "high." Likewise, latched output signal Latch_Output is also a differential signal. The logic level of input signal Latch_Input is switched at 161 while input latch 120 is in the "hold" state corresponding to logic "high" of latched clock signal Latch_CKD at 150. This logic level switching 161 of input signal Latch_Input is held by input latch 120 and is output as logic level switching 171 of latched output signal Latch_Output when input latch 120 is in the "pass" state corresponding to logic "low" of latched clock signal Latch_CKD at 151. Similarly, logic level switching 163 of input signal Latch_Input is held by input latch 120 in the "hold" state corresponding to logic "high" of latched clock signal Latch_CKD at 156, and is output as logic level switching 173 of latched output signal Latch_Output when input latch 120 is in the "pass" state corresponding to logic "low" of latched clock signal Latch_CKD at 157. In other words, input latch 120 passes input signal Latch_Input through when signal Enable has the enabling logic level.

As described herein, when signal Enable has the disabling logic level, the logic level of latched clock signal Latch_CKD is set to the corresponding disabling logic level. In response to the corresponding disabling logic level of latched clock signal Latch_CKD, input latch 120 is configured to hold the logic level of the latched output signal Latch_Output unchanged, regardless of the input signal. For example, when signal Enable has the disabling logic level at 132, input latch 120 is in the "hold" state corresponding to the corresponding disabling logic level, i.e., logic "high," of latched clock signal Latch_CKD at 152. This "hold" state is maintained and latched output signal Latch_Output is unchanged, despite logic level switching 162 of input signal Latch_Input, during a disabling period 175 corresponding to the disabling logic level of signal Enable at 132. In other words, input latch 120 does not pass input signal Latch_Input through when signal Enable has the disabling logic level.

To the contrary, in a comparative circuit in accordance with other approaches, when an enable signal in the comparative circuit has a disabling logic level, a logic level of a latch clock signal is set to logic "low" corresponding to a "pass" state of a latch of the comparative circuit. As a result, the latch of the comparative circuit passes an input signal through even during a disabling period corresponding to the disabling logic level of the enable signal. Unnecessary logic level switchings at the output of the latch during the disabling period the comparative circuit unnecessarily consumes additional power. Latch circuit 100 in accordance with some embodiments avoids such additional, unnecessary power consumption by holding the output of input latch 120 unchanged during disabling period 175. A latch circuit in accordance with some embodiments is applicable to various circuitry and/or electronic devices where a latch is included and is to be disabled during a certain period to reduce power consumption. An example electronic device, i.e., a memory device, is described herein.

Figure 2:
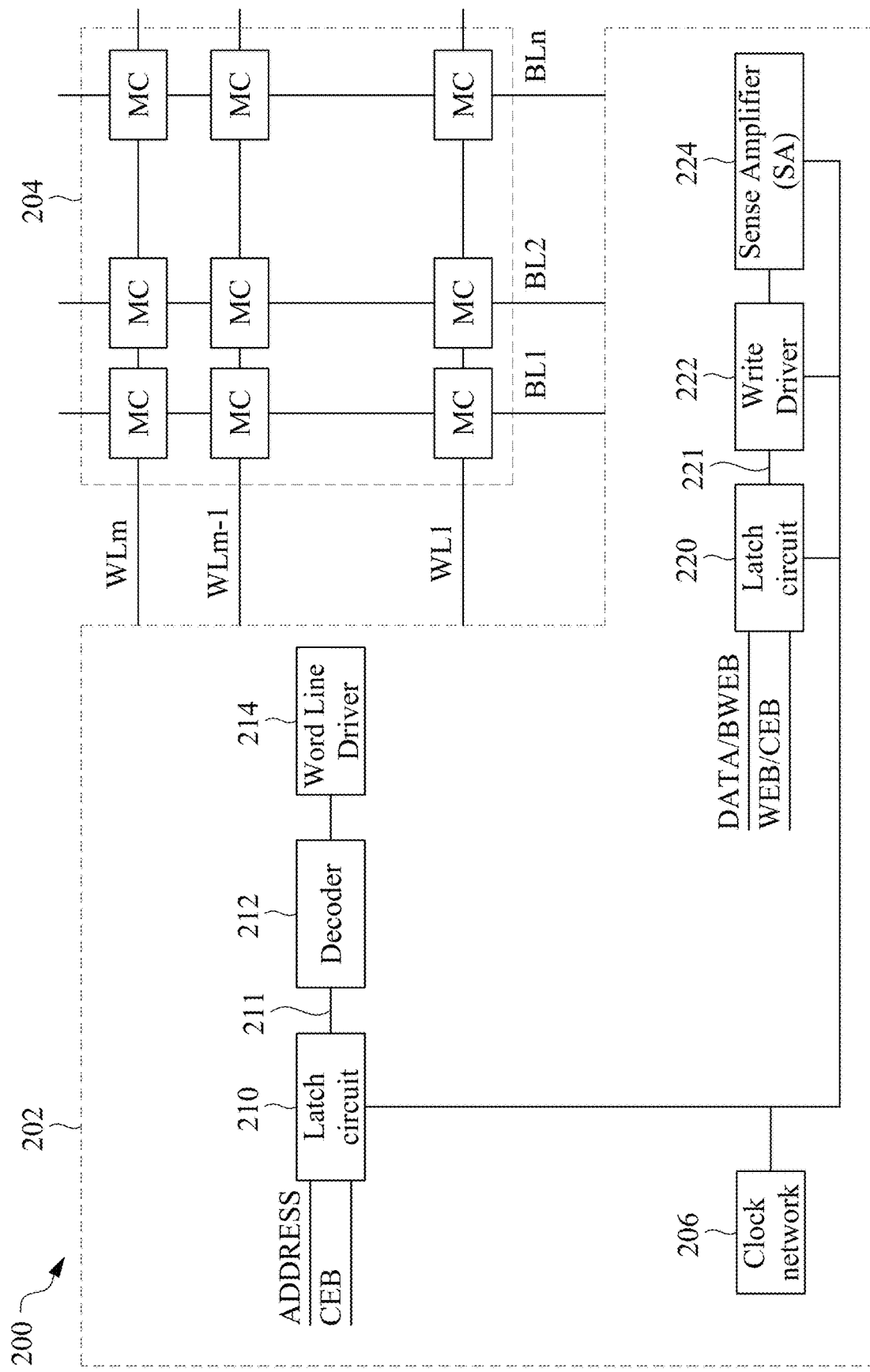
FIG. 2 is a schematic block diagram of a memory device, in accordance with some embodiments.

FIG. 2 is a schematic block diagram of a memory device 200, in accordance with some embodiments. Memory device 200 comprises at least one memory cell MC and a control circuit 202 coupled to control an operation of memory cell MC. In the example configuration in FIG. 2, memory device 200 comprises a plurality of memory cells MC arranged in a plurality of columns and rows in a memory array 204. Memory device 200 further comprises a plurality of (e.g., m) word lines WL1 to WLm extending along the rows, and a plurality of (e.g., n) bit lines BL1 to BLn extending along the columns of memory cells MC. Each of memory cells MC is coupled to control circuit 202 by at least one of the word lines and at least one of the bit lines. Examples of word lines include, but are not limited to, read word lines for transmitting addresses of memory cells MC to be read from, and write word lines for transmitting addresses of memory cells MC to be written to. In at least one embodiment, a set of word lines is configured to perform as both read word lines and write word lines. Examples of bit lines include read bit lines for transmitting data read from memory cells MC indicated by corresponding word lines, and write bit lines for transmitting data to be written to memory cells MC indicated by corresponding word lines. In at least one embodiment, a set of bit lines is configured to perform as both read bit lines and write bit lines. In one or more embodiments, each memory cell MC is coupled to a pair of bit lines referred to as a bit line and a bit line bar.

In the example configuration in FIG. 2, control circuit 202 includes a clock network 206, a latch circuit 210, a decoder 212, a word line driver 214, a latch circuit 220, a write driver 222, and a sense amplifier (SA) 224. Clock network 206 is configured to generate one or more clock signals for the other elements of control circuit 202. Latch circuit 210 is configured to latch an address of one or more memory cells MC to be accessed (e.g., to be reads from or written to) in memory array 204. Decoder 212 is configured to decode the addresses output by latch circuit 210. Word line driver 214 is coupled to drive one or more bit lines corresponding to the addresses decoded by decoder 212, to access the corresponding memory cells MC. Data read from accessed memory cells MC are retrieved through the corresponding bit lines and sensed by SA 224. In at least one embodiment, control circuit 202 further includes a latch circuit to latch read data output by SA 224. Data to be written to accessed memory cells MC are latched by latch circuit 220, and output to write driver 222 which is coupled to drive one or more bit lines to write the data into corresponding memory cells MC. Control circuit 202 further comprises one or more input/output (I/O) ports or pins (not shown) for one or more signal such as address signals, data signals, control signals or the like. Control circuit 202 further comprises a control chip (not shown) configured to control the other component of memory device 200. The described memory device configuration is an example, and other memory device configurations are within the scopes of various embodiments. In at least one embodiment, the memory device is a Static Random Access Memory (SRAM). Other types of memory are within the scopes of various embodiments.

In some embodiments, one or more of latch circuit 210, latch circuit 220 or any other latch circuits (not shown) included in memory device 200 correspond(s) to latch circuit 100 described with respect to FIG. 1A and/or FIG. 1B.

In an example, latch circuit 210 receives a clock signal from clock network 206, a chip enable signal CEB, and an address signal ADDRESS. The clock signal from clock network 206 corresponds to clock signal Internal_CLK, signal CEB corresponds to signal Enable, and signal ADDRESS corresponds to input signal Latch_Input described with respect to FIGS. 1A-1B. Latch circuit 210 outputs an output signal 211 corresponding to latched output signal Latch_Output. Signal CEB is a signal to enable or disable memory device 200. In at least one embodiment, signal CEB is received from external circuitry through an I/O pin or port of memory device 200. When signal CEB has an enabling logic level, e.g., logic "low," latch circuit 210, in accordance with the clock signal, latches addresses in signal Address and passes the latched addresses through as output signal 211 for decoder 212 and word line driver 214, as described herein. When signal CEB has a disabling logic level, e.g., logic "high," latch circuit 210 holds the output thereof unchanged regardless of signal Address, thereby saving power consumption in at least one embodiment, as described herein.

In another example, latch circuit 220 receives a clock signal from clock network 206, at least one of signal CEB or a write enable signal WEB, and at least one of a data signal DATA or a bit-write-mask signal BWEB. The clock signal from clock network 206 corresponds to clock signal Internal_CLK, the at least one of signal CEB or signal WEB corresponds to signal Enable, and the at least one of signal DATA or signal BWEB (referred to herein as signal DATA/BWEB) corresponds to input signal Latch_Input described with respect to FIGS. 1A-1B. Latch circuit 220 outputs an output signal 221 corresponding to latched output signal Latch_Output.

Signal WEB is a signal to enable or disable writing to one or more memory cells MC. Signal DATA includes data to be written to one or more memory cells MC. Signal BWEB is a signal to control selective writing to one or more memory cells MC, e.g., selective writing to one or more memory bits in a memory word. When signal CEB and/or signal WEB has/have an enabling logic level, e.g., logic "low," latch circuit 220, in accordance with the clock signal, latches signal DATA/BWEB and passes the latched signal through as output signal 221 for write driver 222, as described herein. When signal CEB and/or signal WEB has a disabling logic level, e.g., logic "high," latch circuit 220 holds the output thereof unchanged regardless of signal DATA/BWEB, thereby saving power consumption in at least one embodiment, as described herein.

Figure 3A:
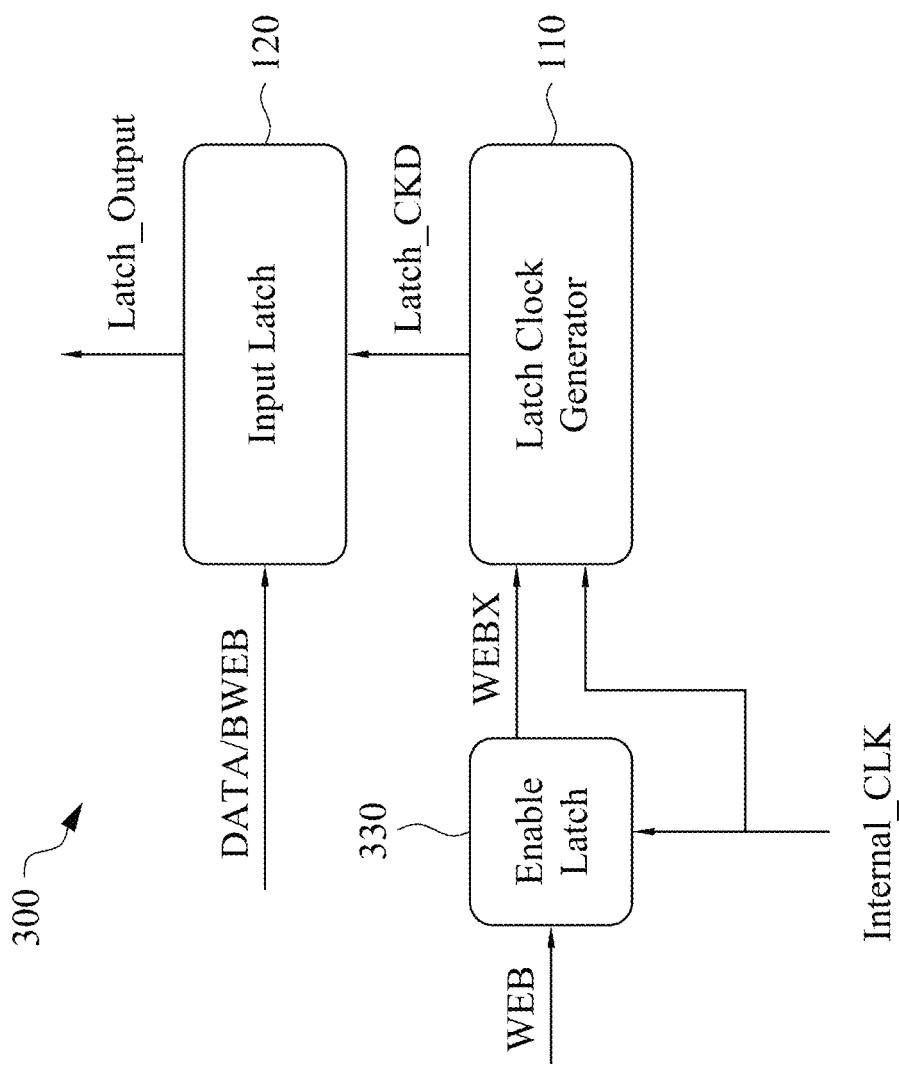
FIG. 3A is a schematic block diagram of a latch circuit, in accordance with some embodiments.

FIG. 3A is a schematic block diagram of a latch circuit 300, in accordance with some embodiments. In some embodiments, latch circuit 300 corresponds to one or more of latch circuit 210, latch circuit 220, or any other latch circuits (not shown) included in memory device 200. Latch circuit 300 comprises latch clock generator 110, input latch 120, and an enable latch 330. Enable latch 330 is a latch having signal WEB as its input signal and clock signal Internal_CLK as its clock signal, and an enable signal WEBX as its output signal. As a latch, enable latch 330 is configured to holds signal WEB, or passes signal WEB through in accordance with different logic levels of clock signal Internal_CLK, as described herein. Enable signal WEBX is input from enable latch 330 into latch clock generator 110, and corresponds to signal Enable described with respect to FIG. 1A and/or FIG. 1B. Signal DATA/BWEB is input into input latch 120, and corresponds to input signal Latch_Input described with respect to FIG. 1A and/or FIG. 1B. The described configuration is an example, and other configurations are within the scopes of various embodiments. For example, in at least one embodiment, signal CEB is supplied as an input signal to enable latch 330 in lieu of, or in combination with, signal WEB. In at least one embodiment, signal ADDRESS is supplied as an input signal to input latch 120 instead of signal DATA/BWEB.

Figure 3B:
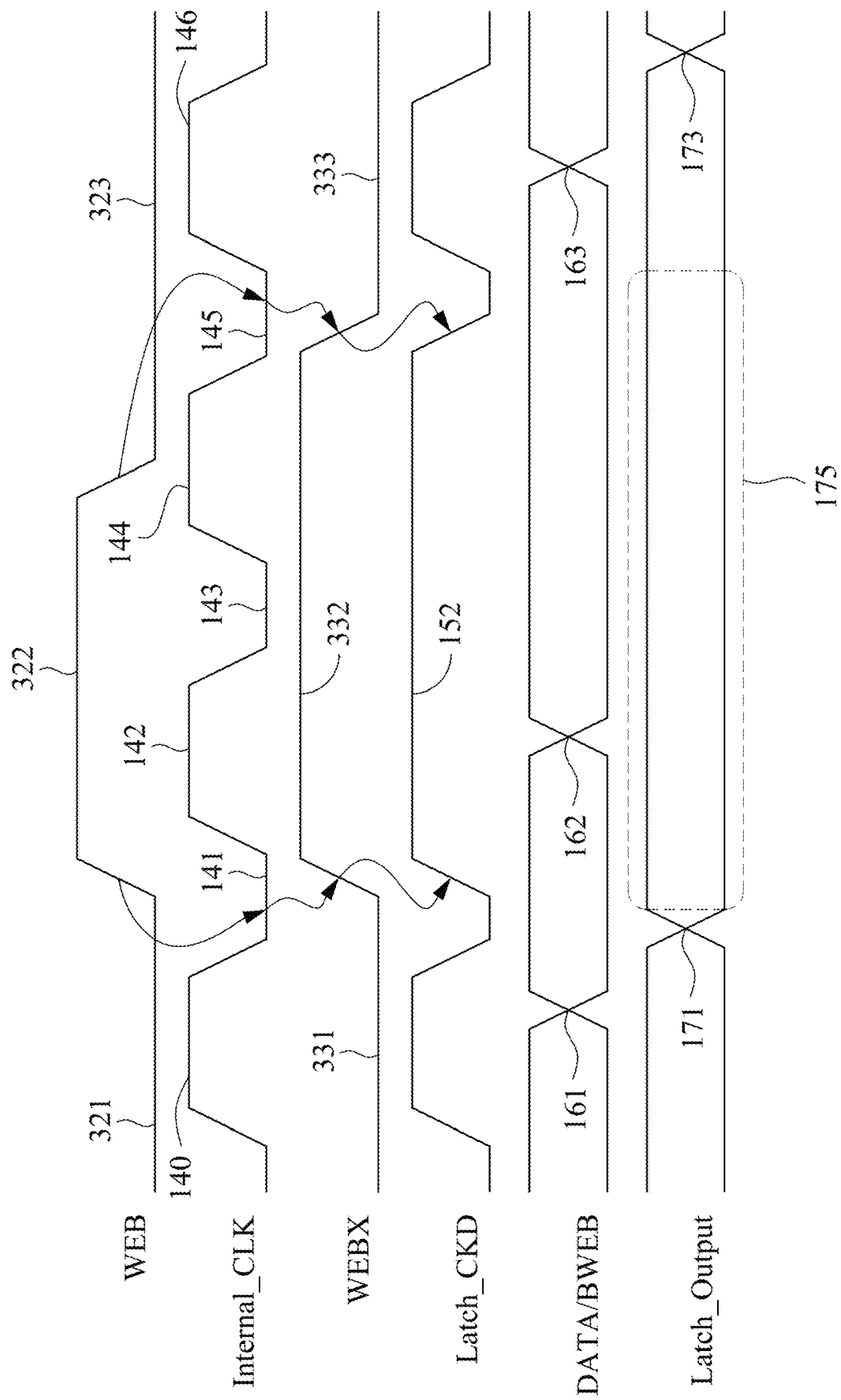
FIG. 3B includes time graphs of various signals in the latch circuit of FIG. 3A.

FIG. 3B includes time graphs of various signals in latch circuit 300 in accordance with some embodiments. Signal WEB has a disabling logic level, e.g., logic "high," at 322, and an enabling logic level, e.g., logic "low," at 321, 323. Enable latch 330 passes or holds signal WEB in accordance with clock signal Internal_CLK. For example, a rising edge between 321 and 322 of signal WEB is passed to the output of enable latch 330 when the logic level of clock signal Internal_CLK is logic "low" at 141. As a result, enable signal WEBX has a corresponding rising edge between a logic "low" at 331 and logic "high" at 332. Further, a falling edge between 322 and 323 of signal WEB is held when the logic level of clock signal Internal_CLK is logic "high" at 144, and is then passed to the output of enable latch 330 when the logic level of clock signal Internal_CLK becomes logic "low" at 145. As a result, enable signal WEBX has a corresponding falling edge between a logic "high" at 332 and logic "low" at 333. Enable signal WEBX corresponds to signal Enable, and is used together with clock signal Internal_CLK by latch clock generator 110 to generate latched clock signal Latch_CKD, which, in turn, is used by input latch 120 to hold or pass signal DATA/BWEB to output latched output signal Latch_Output, as described with respect to FIG. 1A and/or FIG. 1B. The logic level of latched output signal Latch_Output is held unchanged during disabling period 175 corresponding to the disabling logic level of enable signal WEBX at 332. As a result, power consumption is reduced in at least one embodiment, compared to a comparative circuit in accordance with other approaches, as also described with respect to FIG. 1A and/or FIG. 1B.

As can be seen in FIG. 3B, the duration of the disabling logic level of signal WEB at 322 is shorter than the duration of the disabling logic level of enable signal WEBX at 332. If signal WEB was directly supplied to latch clock generator 110 without enable latch 330, disabling period 175 would be shorter than when enable latch 330 is included and enable signal WEBX is supplied to latch clock generator 110. The inclusion of enable latch 330 in latch circuit 300 effectively makes the disabling period corresponding to signal WEB longer, and further reduces power consumption.

Figure 4A:
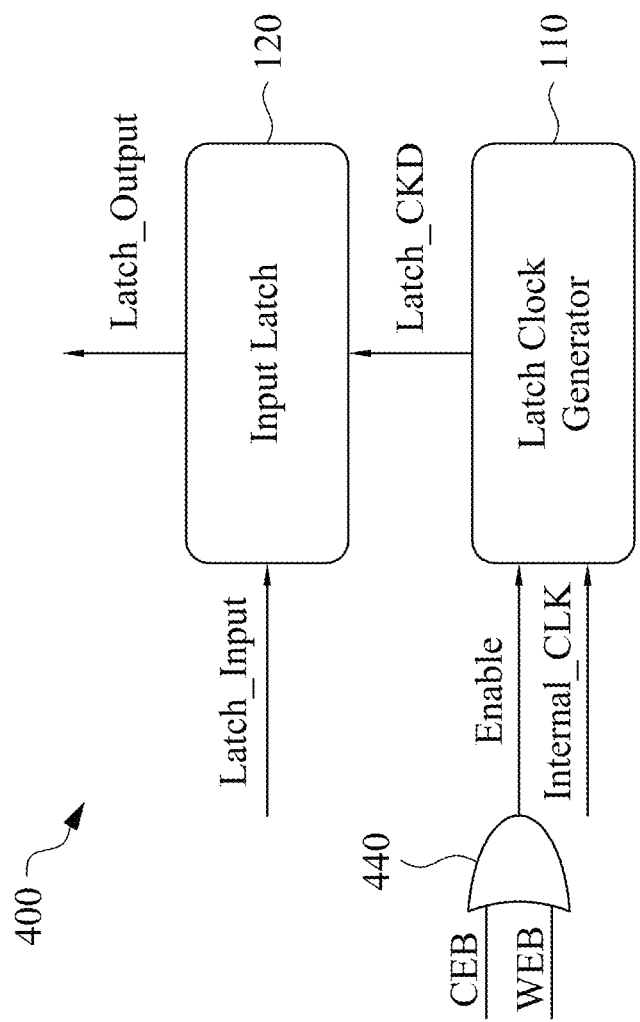
FIG. 4A is a schematic block diagram of a latch circuit, in accordance with some embodiments.

FIG. 4A is a schematic block diagram of a latch circuit 400, in accordance with some embodiments. In some embodiments, latch circuit 400 corresponds to one or more of latch circuit 210, latch circuit 220, or any other latch circuits (not shown) included in memory device 200. Latch circuit 400 comprises latch clock generator 110, input latch 120, and an OR gate 440. OR gate 440 has signal CEB and signal WEB as its input signals, and is configured to generate signal Enable based on signal CEB and signal WEB.

Figure 4B:
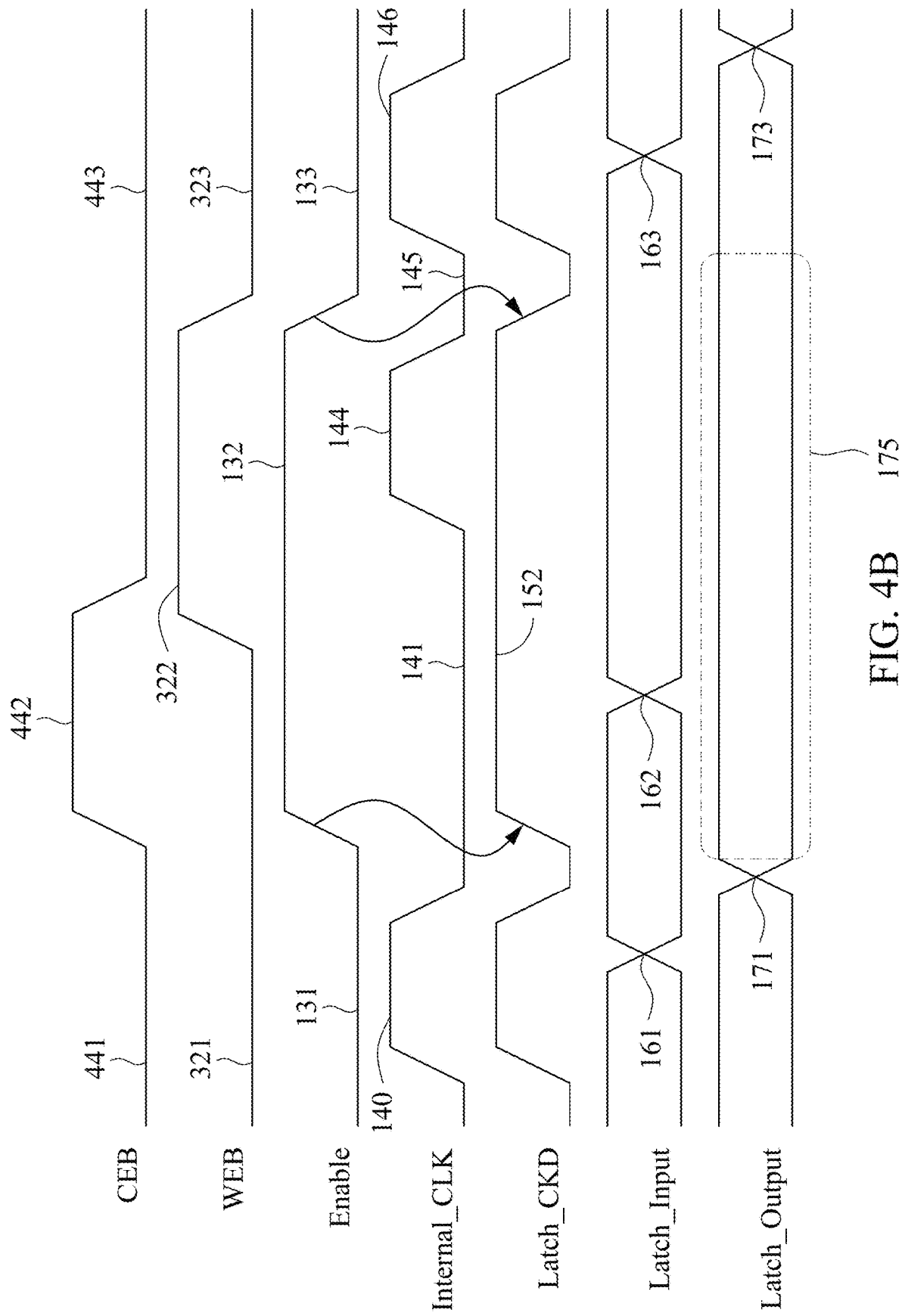
FIG. 4B includes time graphs of various signals in the latch circuit of FIG. 4A.

FIG. 4B includes time graphs of various signals in latch circuit 400 in accordance with some embodiments. As described with respect to FIG. 3B, signal WEB has a disabling logic level, e.g., logic "high," at 322, and an enabling logic level, e.g., logic "low," at 321, 323. Signal CEB has a disabling logic level, e.g., logic "high," at 442, and an enabling logic level, e.g., logic "low," at 441, 443. OR gate 440 generates signal Enable at logic "high" when any signal CEB or signal WEB is at logic "high," resulting in signal Enable having logic "high" at 132, and logic "low" at 131, 133. Beside the described generation of signal Enable from signal CEB and signal WEB, FIG. 4B is further different from FIG. 1B in that clock signal Internal_CLK is disabled during the disabling logic level at logic "high" of signal CEB which disables the memory device including latch circuit 400. Latch circuit 400 otherwise operates in a manner similar to that of latch circuit 100, and holds the logic level of latched output signal Latch_Output unchanged during disabling period 175 corresponding to the disabling logic level of signal Enable. As a result, power consumption is reduced in at least one embodiment, compared to a comparative circuit in accordance with other approaches, as described with respect to FIG. 1A and/or FIG. 1B.

As can be seen in FIG. 4B, the duration of the disabling logic level of signal Enable corresponds to a combination of the duration of the disabling logic level of signal CEB and signal WEB. If each of signal CEB or signal WEB was individually supplied to latch clock generator 110 as an enable signal, disabling period 175 would be shorter than when signal CEB and signal WEB are combined by OR gate 440 to generate signal Enable for latch clock generator 110. The inclusion of OR gate 440 to combine signal CEB and signal WEB effectively makes the disabling period for holding the output of input latch 120 longer, and further reduces power consumption.

Figure 5A:
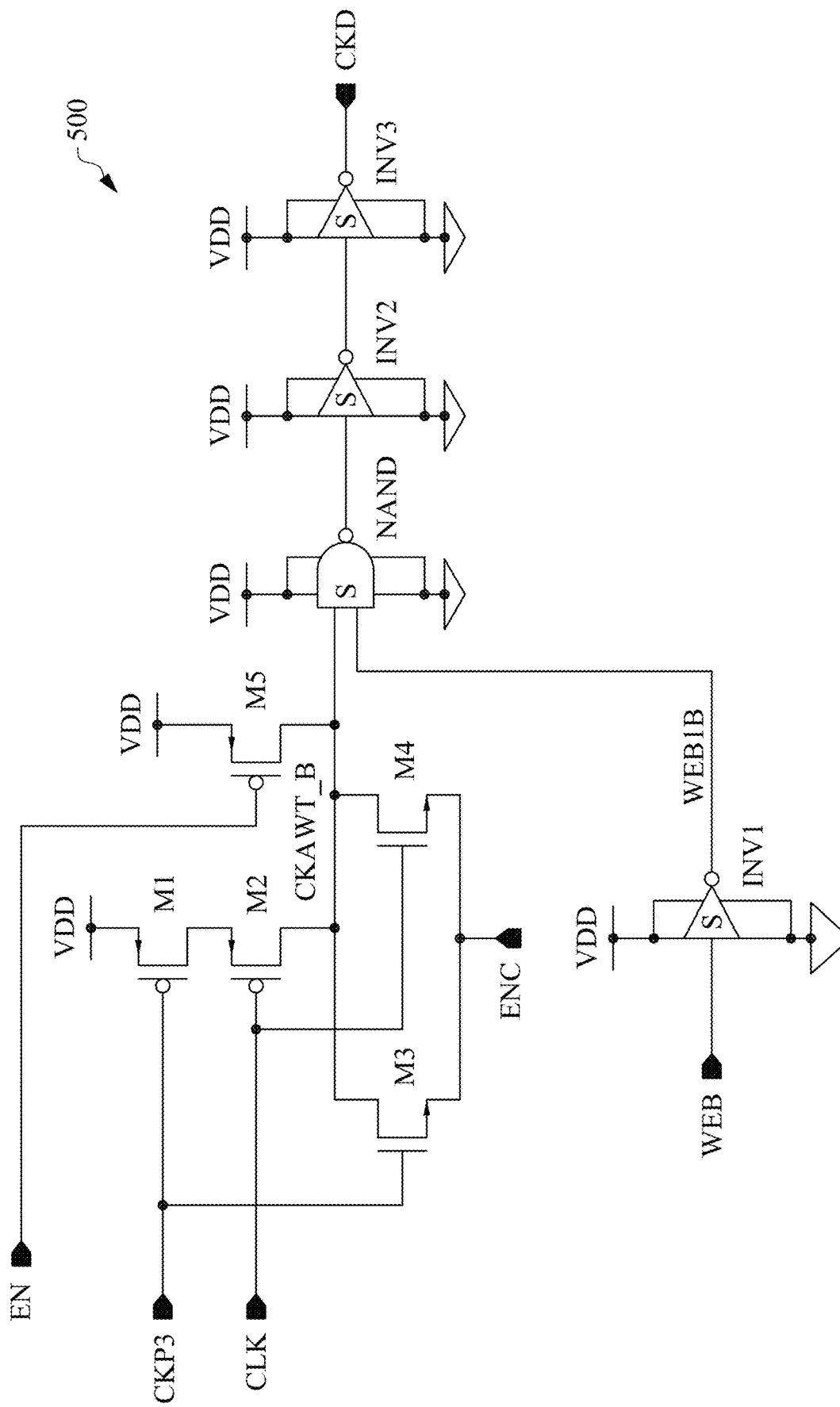
FIG. 5A is a schematic circuit diagram of an example circuit implementation of a latch clock generator, in accordance with some embodiments.

FIG. 5A is a schematic circuit diagram of an example circuit implementation of a latch clock generator 500, in accordance with some embodiments. In some embodiments, latch clock generator 500 corresponds to the latch clock generator of one or more of latch circuit 100, latch circuit 300, latch circuit 400, latch circuit 210, latch circuit 220, or any other latch circuits (not shown) included in a memory device. Latch clock generator 500 comprises transistors M1-M5, inverters INV1-INV3, and a NAND gate. Transistors M1 and M2 are serially coupled between a voltage supply node VDD and a node CKAWT_B. Transistors M3 and M4 are coupled in parallel between node CKAWT_B and a node ENC. Gate terminals of transistors M1 and M3 are coupled to node CLK, and gate terminals of transistors M2 and M4 are coupled to node CKP3. A signal on node CLK corresponds to an external clock signal supplied to latch clock generator 500, e.g., from a clock network as described herein. A signal on node CKP3 is an inverted signal of the external clock signal on node CLK. Transistor M5 is coupled between node VDD and node CKAWT_B. A gate terminal of transistor M5 is coupled to a node EN. A signal on node EN is a further enable signal. A signal on node CKAWT_B corresponds to clock signal Internal_CLK described herein.

Inverter INV1 has an input coupled to a node WEB to receive signal WEB, and an output coupled to node WEB1B to output an inverted signal of signal WEB thereto. Signal WEB corresponds to signal Enable described herein. Signal WEB is an example enable signal in at least one embodiment. In some embodiments, another enable signal, such as signal CEB, is supplied to the input of inverter INV1 in lieu of, or in combination with, signal WEB, as described herein.

The NAND gate has a first input coupled to node CKAWT_B, a second input coupled to node WEB1B, and an output at which a result of a NAND operation on the signals at node CKAWT_B and node WEB1B is output. The output of the NAND gate is coupled through serially coupled inverters INV2 and INV3 to a node CKD. A signal on node CKD corresponds to latched clock signal Latch_CKD described herein.

FIG. 5B is a truth table 510 corresponding to latch clock generator 500 of FIG. 5A. Columns 512-514 of truth table 510 include corresponding logic levels of various signals at nodes WEB, EN, WEB1B, CKD in latch clock generator 500. For simplicity, a signal on each node is referred to by the same name as the node. In columns 512-514, "0" indicates logic "low," "1" indicates logic "high," "0=>1" indicates a rising edge from logic "low" to logic "high," and "1=>0" indicates a falling edge from logic "high" to logic "low." In column 514, "CKD" indicates that signal CKD retains its current logic level.

Column 515 in truth table 510 include "hold" and "pass" states of a D-latch in a latch circuit containing latch clock generator 500. The D-latch is coupled to receive signal CKD as its clock signal, and corresponds to input latch 120 described herein. The latch circuit including the D-latch and latch clock generator 500 corresponds to one or more of latch circuit 100, latch circuit 300, latch circuit 400, latch circuit 210, latch circuit 220, or any other latch circuits (not shown) included in a memory device.

Column 516 in truth table 510 include operations of a memory device including the latch circuit with the D-latch and latch clock generator 500. The operations in column 516 are determined by logic levels of signal WEB and signal EN. For example, "write" in column 516 indicates that the memory device is enabled to perform a write operation for writing to one or more corresponding memory cells when signal EN has an enabling logic level at logic "high," and signal WEB has an enabling logic level at logic "low" or on a rising edge from logic "low" to logic "high." In other situations, "non-write" in column 516 indicates that the memory device does not perform a write operation in corresponding memory cells.

As can be seen at rows 517, 518 of truth table 510, when both signal EN and signal WEB have disabling logic levels (logic "low" and logic "high", respectively), the D-latch is in the "hold" state, and prevents its input signal from being passed to its output and avoids unnecessary logic level switchings at its output. As a result, power consumption is reduced in at least one embodiment. This situation is further described with respect to FIG. 5C.

Figure 5C:
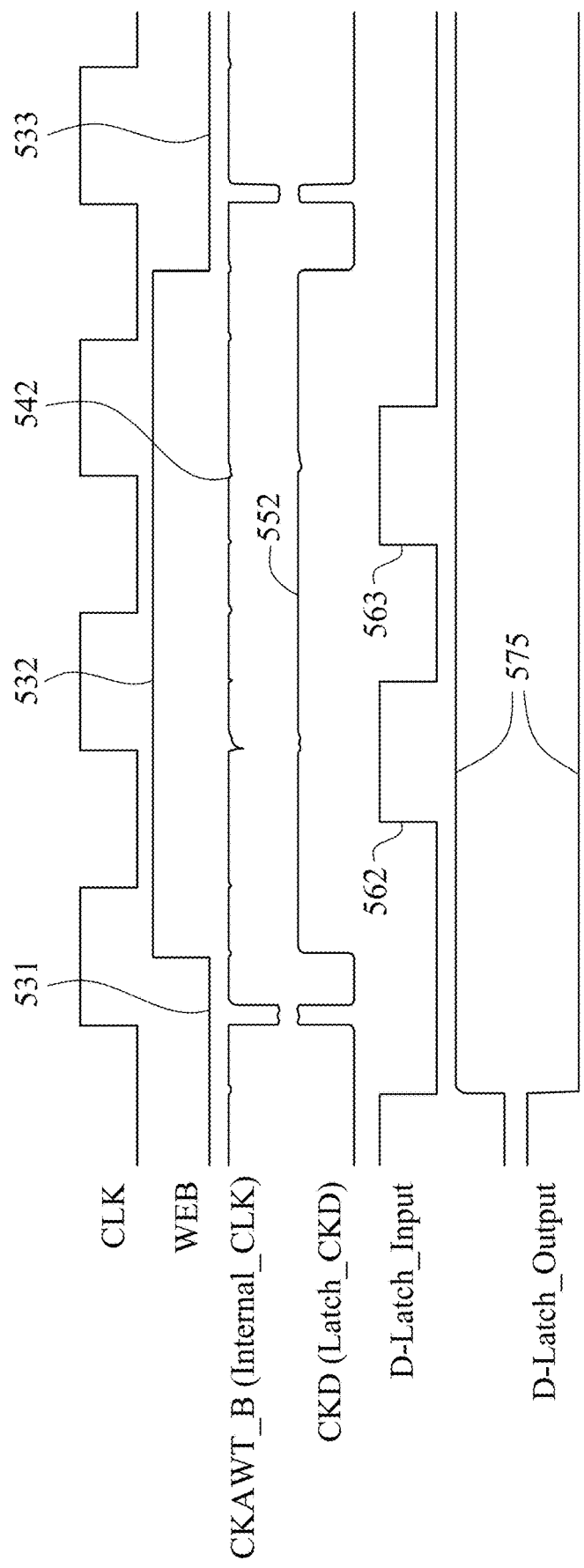
FIG. 5C includes time graphs of various signals in a latch circuit including the latch clock generator of FIG. 5A.

FIG. 5C includes time graphs of various signals in a latch circuit including latch clock generator 500. The latch circuit, as described with respect to FIG. 5B, includes a D-latch corresponding to input latch 120. In FIG. 5C, external clock signal CLK includes a plurality of clock pulses in accordance with a clock frequency. Signal WEB corresponds to signal Enable described with respect to FIG. 1B, and has a disabling logic level of logic "high" at 532, and an enabling logic level of logic "low" at 531, 533. Signal CKAWT_B corresponds to clock signal Internal_CLK described with respect to FIG. 1B, and includes a plurality of clock pulses (not shown in FIG. 5C) corresponding to the clock pulses of external clock signal CLK when signal EN has an enabling logic level of logic "high." When signal EN has a disabling logic level of logic "low," signal CKAWT_B has a logic level of logic "high" at 542. The situation when both signal EN and signal WEB have disabling logic levels described with respect to rows 517, 518 in truth table 510 corresponds to the period in FIG. 5C when both signal WEB and signal CKAWT_B are at logic "high," at 532 and 542, respectively. The NAND gate performs a NAND operation on inverted signal WEB1B (not shown in FIG. 5C) of signal WEB and signal CKAWT_B, and output signal CKD which corresponds to latched clock signal Latch_CKD described with respect to FIG. 1B. A logic level of signal CKD is logic "high" at 552 corresponding to the situation when both signal EN and signal WEB have disabling logic levels. Signal CKD is supplied as a clock signal to the D-latch corresponding to input latch 120, and causes the D-latch to hold its output signal D-Latch_Output unchanged, at 575, despite logic level switchings 562, 563 in its input signal D-Latch_Input. As a result, unnecessary logic level switchings when both signal EN and signal WEB have disabling logic levels are avoided, and power consumption is reduced in at least one embodiment.

In some embodiments, by including at least one enable signal in the generation of a clock signal for a latch, an output of the latch is held unchanged, regardless of an input signal to the latch, when the enable signal has a disabling logic level. As a result, power consumption is reduced in at least one embodiment. In one or more embodiments, pin power is reduced by about 79~94%.

In some embodiments, such inclusion of at least one enable signal in the generation of the clock signal for a latch is implementable by a few standard logic elements, such as OR gate, NAND gate, inverter or the like. As a result, additional requirements for power consumption and/or chip area are negligible in at least one embodiment. In one or more embodiments, additional elements for inclusion of at least one enable signal in the generation of the clock signal for a latch are placeable in the floorplan of a preexisting latch clock generator, without increasing the chip area.

In some embodiments, by reducing or preventing signal switching at the output of a latch when an enable signal has a disabling logic level, coupling noise is reduced which, in turn, results in better (shorter) timing. For example, coupling noise from write true (WT) and/or write compliment (WC) lines on corresponding bit lines is reduced in at least one embodiment, saving about 11% on timing.

Figure 6:
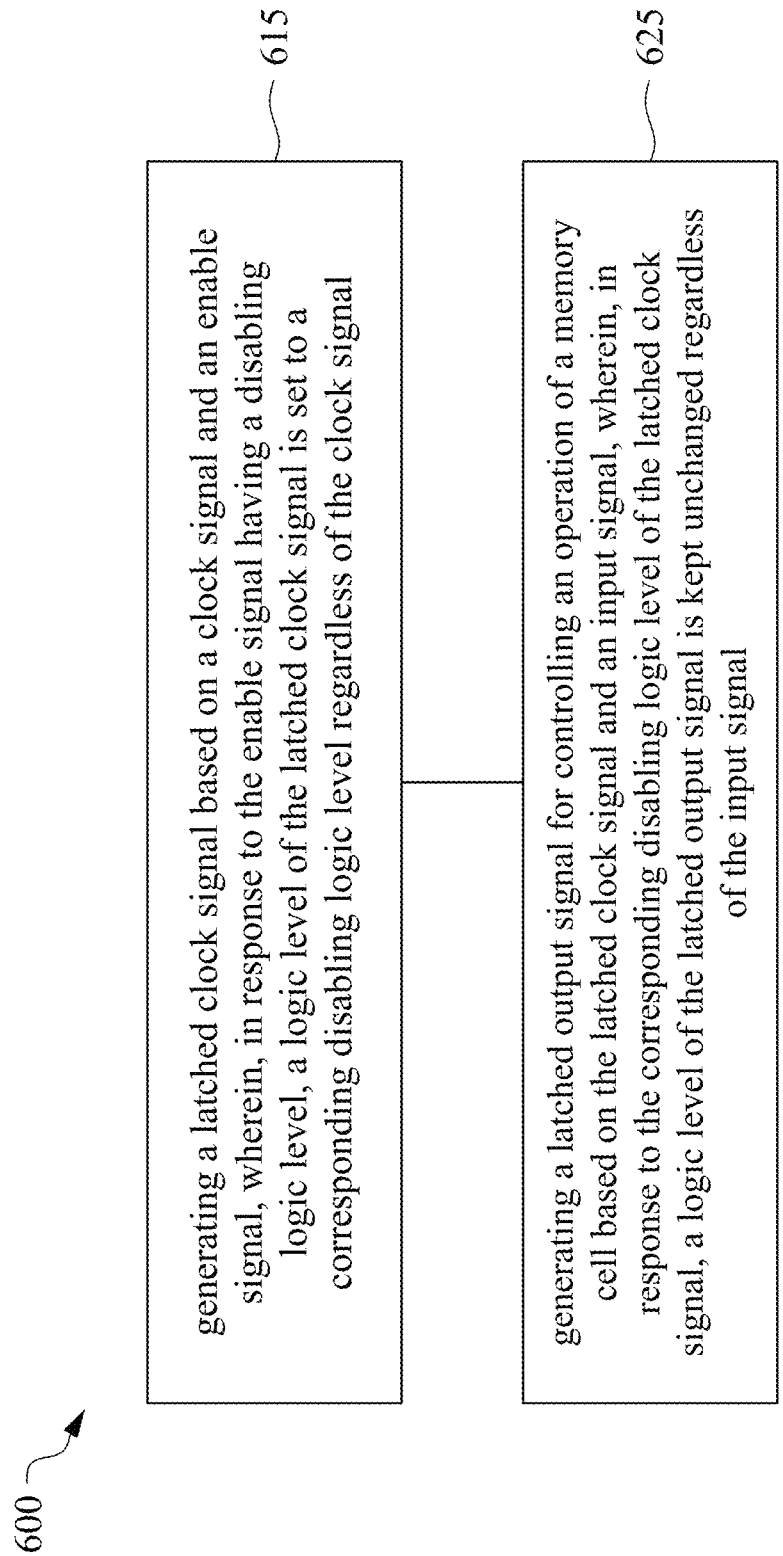
FIG. 6 is a flowchart of a method in accordance with some embodiments.

FIG. 6 is a flowchart of a method 600 in accordance with some embodiments. In at least one embodiment, the method 600 is performed by one or more of latch circuit 100, latch circuit 300, latch circuit 400, latch circuit 210, latch circuit 220, or any other latch circuits (not shown) included in a memory device.

At operation 615, a latched clock signal is generated based on a clock signal and an enable signal. For example, latched clock signal Latch_CKD is generated based on clock signal Internal_CLK and signal Enable, as described with respect to FIG. 1A and/or FIG. 1B. Further, in response to the enable signal having a disabling logic level, a logic level of the latched clock signal is set to a corresponding disabling logic level regardless of the clock signal. For example, when signal Enable has a disabling logic level (e.g., logic "high" at 132), the logic level of latched clock signal Latch_CKD is set to a corresponding disabling logic level (e.g., logic "high" at 152) regardless of clock signal Internal_CLK, as described with respect to FIG. 1B.

At operation 625, a latched output signal for controlling an operation of a memory cell is generated based on the latched clock signal and an input signal. For example, a latched output signal Latch_Output for controlling an operation of a memory cell is generated based on latched clock signal Latch_CKD and an input signal Latch_Input. Further, in response to the disabling logic level of the latched clock signal, a logic level of the latched output signal is kept unchanged regardless of the input signal. For example, when latched clock signal Latch_CKD has the disabling logic level (e.g., logic "high" at 152), the logic level of latched output signal Latch_Output is kept unchanged (e.g., at 175) regardless of input signal Latch_Input, as described with respect to FIG. 1B.

In at least one embodiment, all operations 615, 625 are automatically performed without user input or intervention.

The described methods and algorithms include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a latch circuit comprises a latch clock generator configured to generate a latched clock signal based on a clock signal and a first enable signal, and an input latch coupled to the latch clock generator to receive the latched clock signal. The input latch is configured to generate a latched output signal based on the latched clock signal and an input signal. In response to the first enable signal having a disabling logic level, the latch clock generator is configured to set a logic level of the latched clock signal to a corresponding disabling logic level, regardless of the clock signal. The latch clock generator comprises a first inverter configured to generate an inverted signal of the first enable signal, and a NAND gate coupled to the first inverter to receive the inverted signal of the first enable signal. The NAND gate is configured to generate the latched clock signal based on the clock signal and the inverted signal of the first enable signal.

In some embodiments, a memory device comprises a memory cell, and a control circuit coupled to control an operation of the memory cell. The control circuit comprises a latch clock generator configured to generate a latched clock signal based on a clock signal and an enable signal, and an input latch coupled to the latch clock generator to receive the latched clock signal. The input latch is configured to generate a latched output signal based on the latched clock signal and an input signal. The enable signal corresponds to at least one of a chip enable signal to enable or disable the memory device, or a write enable signal to enable or disable writing to the memory cell.

In some embodiments, a method of operating a memory device having a memory cell comprises generating an internal clock signal based on a clock signal and a first enable signal, generating a latched clock signal based on the internal clock signal and a second enable signal, and generating a latched output signal for controlling an operation of the memory cell based on the latched clock signal and an input signal. In the generating the latched clock signal, in response to the second enable signal having a disabling logic level, a logic level of the latched clock signal is set to a corresponding disabling logic level regardless of the clock signal and the first enable signal. In the generating the latched output signal, in response to the corresponding disabling logic level of the latched clock signal, a logic level of the latched output signal is held unchanged regardless of the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A latch circuit, comprising:
a latch clock generator configured to generate a latched clock signal based on a clock signal and a first enable signal; and
an input latch coupled to the latch clock generator to receive the latched clock signal, the input latch configured to generate a latched output signal based on the latched clock signal and an input signal,
wherein, in response to the first enable signal having a disabling logic level, the latch clock generator is configured to set a logic level of the latched clock signal to a corresponding disabling logic level, regardless of the clock signal,
wherein the latch clock generator comprises: a NAND gate and a transistor,
wherein the NAND gate comprises:
a first input configured to receive a signal corresponding to the first enable signal,
a second input coupled to an internal node to receive an internal clock signal corresponding to the clock signal, and
an output at which the NAND gate is configured to output the latched clock signal, and
wherein the transistor comprises:
a first terminal coupled to a node of a power supply voltage,
a second terminal coupled to the internal node, and
a gate terminal configured to receive a second enable signal.

2. The latch circuit of claim 1, wherein
in response to the corresponding disabling logic level of the latched clock signal, the input latch is configured to hold a logic level of the latched output signal unchanged, regardless of the input signal having one or more logic level switchings while the latched clock signal is having the corresponding disabling logic level.

3. The latch circuit of claim 2, wherein
in response to the first enable signal having an enabling logic level different from the disabling logic level,
the latch clock generator is configured to switch the logic level of the latched clock signal in accordance with the clock signal, and
in response to the switched logic level of the latched clock signal, the input latch is configured to switch the logic level of the latched output signal in accordance with the input signal.

4. The latch circuit of claim 1, further comprising:
an enable latch configured to generate the first enable signal based on the clock signal and a further enable signal,
wherein the latch clock generator is coupled to the enable latch to receive the first enable signal.

5. The latch circuit of claim 1, further comprising:
an OR gate configured to generate the first enable signal based on further enable signals,
wherein the latch clock generator is coupled to the OR gate to receive the first enable signal.

6. The latch circuit of claim 1, wherein
the latch clock generator further comprises:

first and second transistors serially coupled between the internal node and the node of the power supply voltage, and third and fourth transistors coupled in parallel between the internal node and a further node, gate terminals of the first and third transistors are configured to receive an inverted signal of the clock signal, and gate terminals of the second and fourth transistors are configured to receive the clock signal.

7. A memory device, comprising:
a memory cell; and
a control circuit coupled to control an operation of the memory cell, the control circuit comprising:
 a latch clock generator configured to generate a latched clock signal based on a clock signal and an enable signal; and
 an input latch coupled to the latch clock generator to receive the latched clock signal, the input latch configured to generate a latched output signal based on the latched clock signal and an input signal,
wherein the enable signal corresponds to
 a chip enable signal to enable or disable the memory device.

8. The memory device of claim 7, wherein
the input signal comprises one of
 a data signal containing data to be written to the memory cell,
 a bit-write-mask signal to control selective writing to the memory cell, or
 an address signal containing an address of the memory cell.

9. The memory device of claim 7, wherein
the input signal comprises a bit-write-mask signal to control selective writing to the memory cell.

10. The memory device of claim 7, wherein
the input signal comprises one of
 a data signal containing data to be written to the memory cell, or
 a bit-write-mask signal to control selective writing to the memory cell.

11. The memory device of claim 7, wherein
the input signal comprises one of
 an address signal containing an address of the memory cell, or
 a bit-write-mask signal to control selective writing to the memory cell.

12. The memory device of claim 7, wherein
the latch clock generator comprises a NAND gate configured to
 receive the clock signal and an inverted signal of the enable signal, and
 generate a signal corresponding to the latched clock signal, based on the clock signal and the inverted signal of the enable signal.

13. A method of operating a memory device having a memory cell, the method comprising:
generating an internal clock signal based on a clock signal and a first enable signal;
generating a latched clock signal based on the internal clock signal and a second enable signal; and
generating a latched output signal for controlling an operation of the memory cell based on the latched clock signal and an input signal,
wherein
in said generating the latched clock signal, in response to the second enable signal having a disabling logic level, a logic level of the latched clock signal is set to a corresponding disabling logic level regardless of the clock signal and the first enable signal, and in said generating the latched output signal,
 in response to the corresponding disabling logic level of the latched clock signal, a logic level of the latched output signal is held unchanged regardless of the input signal having one or more logic level switchings while the second enable signal is having the disabling logic level.

14. The method of claim 13, wherein
in said generating the internal clock signal,
 in response to the first enable signal having a disabling logic level, a logic level of the internal clock signal is held unchanged regardless of the clock signal, and
 in response to the first enable signal having an enabling logic level, the logic level of the internal clock signal is switched in accordance with the clock signal,
in said generating the latched clock signal,
 in response to the logic level of the internal clock signal being switched in accordance with the clock signal and the second enable signal having an enabling logic level different from the disabling logic level, the logic level of the latched clock signal is switched in accordance with the clock signal, and
in said generating the latched output signal,
 in response to the switched logic level of the latched clock signal, the logic level of the latched output signal is switched in accordance with the input signal.

15. The method of claim 13, wherein
the second enable signal corresponds to at least one of
 a chip enable signal to enable or disable the memory device, or
 a write enable signal to enable or disable writing to the memory cell.

16. The method of claim 15, wherein
the input signal comprises one of
 a data signal containing data to be written to the memory cell,
 a bit-write-mask signal to control selective writing to the memory cell, or
 an address signal containing an address of the memory cell.

17. The method of claim 13, wherein at least one of
the second enable signal corresponds to a chip enable signal to enable or disable the memory device, or
the input signal comprises a bit-write-mask signal to control selective writing to the memory cell.

18. The latch circuit of claim 1, wherein
the latch clock generator further comprises a first inverter comprising:
 an input configured to receive the first enable signal, and
 an output coupled to the first input of the NAND gate.

19. The latch circuit of claim 18, wherein
the latch clock generator further comprises second and third inverters serially connected to the output of the NAND gate.

20. The memory device of claim 12, wherein
the NAND gate comprises:
 a first input configured to receive the inverted signal of the enable signal, and a second input coupled to an internal node to receive an internal clock signal corresponding to the clock signal, and the transistor comprises:
a first terminal coupled to a node of a power supply voltage,
a second terminal coupled to the internal node, and
a gate terminal configured to receive a further enable signal.

\* \* \* \* \*